United States Patent
Saruwatari et al.

(10) Patent No.: US 8,718,109 B2
(45) Date of Patent: May 6, 2014

(54) LASER ARRAY LIGHT SOURCE UNIT

(75) Inventors: Naoto Saruwatari, Osaka (JP);
Shigekazu Yamagishi, Osaka (JP); Shu Nanba, Osaka (JP); Shigeaki Sakatani, Osaka (JP); Fumio Yukimoto, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 0 days.

(21) Appl. No.: 13/469,102

(22) Filed: May 11, 2012

(65) Prior Publication Data

US 2012/0287954 A1 Nov. 15, 2012

(30) Foreign Application Priority Data

May 13, 2011 (JP) ................................. 2011-108705
Apr. 19, 2012 (JP) ................................. 2012-095882

(51) Int. Cl.
*H01S 3/04* (2006.01)
(52) U.S. Cl.
USPC .......................................................... 372/34
(58) Field of Classification Search
CPC  H01S 5/02469; H01S 5/02212; H01S 5/4025
USPC .................... 372/34, 35, 36, 50.121
See application file for complete search history.

(56) References Cited

FOREIGN PATENT DOCUMENTS

| JP | 11-261164 | * | 9/1999 | ............... H01S 3/18 |
| JP | H11-261164 A | | 9/1999 | |
| JP | 2004-325929 | * | 11/2004 | ............. G02B 26/10 |
| JP | 2004-325929 A | | 11/2004 | |
| JP | 2005-093599 | * | 4/2005 | ............. H01S 5/024 |
| JP | 2005-093599 A | | 4/2005 | |

* cited by examiner

*Primary Examiner* — Jessica Stultz
*Assistant Examiner* — Tuan Nguyen
(74) *Attorney, Agent, or Firm* — Judge Patent Associates

(57) ABSTRACT

A laser array light source unit 1 includes: a plurality of semiconductor lasers 2 each including a main body portion 2a and a leg portion 2b with two leading electrodes; a laser holder 3 holding the main body portions 2a, and having through-holes for the leg portions 2b; a pressing member 5 for fixing the semiconductor lasers 2 to the laser holder 3; an insulator 4 including a plurality of electrode insertion portions 4f having through-holes for the leading electrodes; and a wiring base 6 for electrically connecting at least two of the semiconductor lasers 2 in series. The insulator 4 includes a connecting portion 4b for connecting the plurality of electrode insertion portions 4f in the same direction in which the plurality of semiconductor lasers 2 are arranged. The wiring base 6 includes first through-holes into which the leading electrodes of the semiconductor lasers 2 are inserted.

12 Claims, 16 Drawing Sheets

CUT ALONG B-B

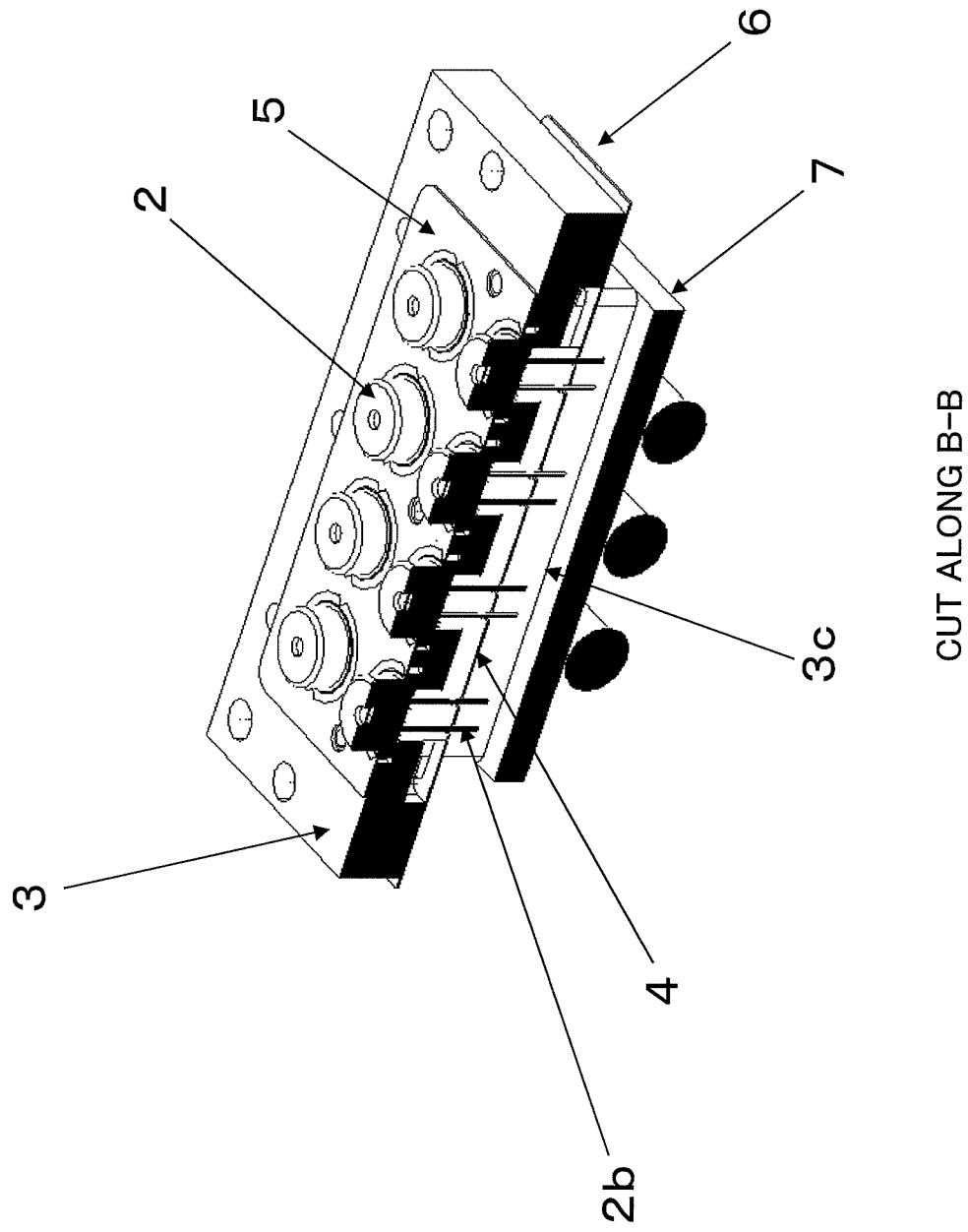

CUT ALONG B-B

CUT ALONG A-A

CUT ALONG B-B

LASER ARRAY LIGHT SOURCE UNIT

BACKGROUND OF THE INVENTION

1. Field of the Invention

The present invention relates to laser array light source units, and more particularly relates to a laser array light source unit configured to efficiently release heat generated from a plurality of semiconductor lasers.

2. Description of the Background Art

As means for efficiently obtaining large images, projection-type image display devices such as projectors are conventionally used that irradiate a spatial light modulation element, such as a small DMD (Digital Micromirror Device) for forming images based on video signals, with light from a light source such as a mercury lamp, and magnifies and projects an optical image on a screen by use of a projection lens.

In the past, solid light sources such as LEDs and semiconductor lasers have been considered, due to their insufficient brightness, to be difficult to apply to image display systems such as projectors. Nowadays, however, the use of these solid light sources as light sources of image display systems such as projectors is drawing attention because of improvement in luminance efficiency of the solid light sources and practical application of high-intensity RGB primary color light, as well as because of environmental consciousness.

In particular, there is a case where, in a projector including semiconductor lasers as light sources, light beams emitted from a plurality of solid light sources electrically connected in series are condensed and used when a sufficient amount of light cannot be obtained from a single light source. In such a case, it is important that heat emitted from each semiconductor laser is efficiently released to maintain a high output. In addition, it is important that, when the plurality of semiconductor lasers are electrically connected in series, leading electrodes of each semiconductor laser are separated physically and electrically so as to prevent the leading electrodes from contacting each other to cause shorting out or radio wave noise.

Japanese Laid-Open Patent Publication No. H11-261164 discloses a device that includes a guide member having tapered guide holes formed at positions corresponding respectively to a plurality of leading electrodes of a semiconductor laser so as to prevent error from occurring when the leading electrodes are to be inserted in a circuit board. Japanese Laid-Open Patent Publication No. 2005-93599 and Japanese Laid-Open Patent Publication No. 2004-325929 each disclose a device having a structure in which leading electrodes of a semiconductor laser are physically separated from each other so as to prevent the leading electrodes from contacting each other to cause shorting out or radio wave noise.

SUMMARY OF THE INVENTION

The device disclosed in Japanese Laid-Open Patent Publication No. 2004-325929 is one using a single light source and implemented as a copy machine, and wiring for electrically connecting a plurality of semiconductor lasers in series is not taken into account. Japanese Laid-Open Patent Publication Nos. H11-261164, 2005-93599 and 2004-325929 do not disclose a device including a plurality of semiconductor lasers and having a structure that can efficiently release heat generated from the plurality of semiconductor lasers and that can easily be built.

The present invention has been made in view of the conventional problems, and an object of the present invention is to provide a laser array light source unit having a structure that can efficiently release heat generated from semiconductor lasers, that can easily be built, and that can realize physical and electrical separation even when a plurality of semiconductor lasers are densely arranged.

The laser array light source unit of the present invention includes: a plurality of semiconductor lasers each including a main body portion and a leg portion with two leading electrodes; a laser holder including receiving surfaces for holding the main body portions of the plurality of semiconductor lasers, and through-holes into which the leg portions of the plurality of semiconductor lasers are inserted; a pressing member for fixing the semiconductor lasers to the laser holder; an insulator including a plurality of electrode insertion portions having through-holes into which the respective leading electrodes of the plurality of semiconductor lasers are inserted; and a wiring base for electrically connecting at least two of the plurality of semiconductor lasers in series. The insulator includes a connecting portion for connecting the plurality of electrode insertion portions in the same direction in which the plurality of semiconductor lasers are arranged, and the wiring base includes first through-holes into which the respective leading electrodes of the plurality of semiconductor lasers are inserted.

Since the laser array light source unit provided by the present invention has the above structure, the laser array light source unit can efficiently release heat generated from the plurality of semiconductor lasers, can easily be built, and can realize physical and electrical separation even when the plurality of semiconductor lasers are densely arranged.

Preferably, a heat-releasing surface is formed on a surface of the laser holder opposite to a surface on which the receiving surfaces are formed, and the laser array light source unit further includes a cooling device having a heat-receiving surface that contacts the heat-releasing surface.

With this structure of the present invention, heat generated from the semiconductor lasers is efficiently transferred to the heat-receiving surface of the cooling device after propagating to the heat-releasing surface of the laser holder, and thus the efficiency of cooling can be improved.

Preferably, each of the through-holes of the insulator into which the leading electrodes are inserted includes: a leading electrode inlet into which one of the leading electrodes is inserted; a small-diameter portion formed by tapering a diameter of the through-hole along the insertion direction; and a leading electrode outlet formed by gradually expanding the diameter of the through-hole from the small-diameter portion.

With this structure of the present invention, when the laser array light source unit of the present invention is to be built, the two leading electrodes of the leg portion of each semiconductor laser are inserted along the tapered portions of the through-holes of the insulator. Therefore, it is possible to prevent error in the insertion and breakage of the leading electrodes due to error in the insertion. Further, since the portion whose diameter is gradually expanded is provided, a solder applied when soldering is performed can enter the portion whose diameter is gradually expanded, and thus poor soldering can be prevented. In addition, since the small-diameter portion is provided, the leading electrodes can be held in contact with the small-diameter portion, and thus the positions of the semiconductor lasers inserted into the laser holder can be fixed with improved precision, and further, the leading electrodes of each semiconductor laser can be separated from each other physically and electrically.

Preferably, a diameter of the first through-holes of the wiring base into which the respective leading electrodes of the plurality of the semiconductor lasers are inserted is larger than the diameter of the small-diameter portions of the through-holes of the insulator.

With this structure of the present invention, the leading electrodes having been passed through the through-holes of the insulator can easily be passed through the first through-holes of the wiring base. Therefore, it is possible to prevent error in the insertion and breakage of the leading electrodes due to error in the insertion with greater certainty.

Preferably, in the wiring base, a width of a row wiring portion provided for each row of the semiconductor lasers arranged along the insulator is almost equal to a width of the insulator.

With this structure of the present invention, the wiring base is located at a position overlapping a position at which the insulator is located, which prevents the wiring base from excessively occupying a space used for releasing heat of the laser array light source unit. As a result, a sufficient space for efficiently releasing heat generated from the semiconductor lasers can be secured.

Preferably, the connecting portion of the insulator has a surface formed in the same plane in which the leading electrode outlet of the electrode insertion portion is formed.

With this structure of the present invention, the connecting portion is located along the wiring base, and therefore, does not narrow a space used for heat release in the laser array light source unit 1. Accordingly, a sufficient space for efficiently releasing heat generated from the semiconductor lasers can be secured.

Preferably, the wiring base includes a second through-hole different from the first through-holes into which the leading electrodes are inserted, and when a reference hole is provided in the laser holder, the second through-hole is located at a position corresponding to the reference hole. The first through-holes of the wiring base are located at positions corresponding to the through-holes of the insulator in a state where the second through-hole and the reference hole are located so as to correspond to each other. Alternatively, it is preferable that the wiring base includes a second through-hole different from the first through-holes into which the leading electrodes are inserted, and when a reference pin is provided in the laser holder, the reference pin passes through the second through-hole. The first through-holes of the wiring base are located at positions corresponding to the through-holes of the insulator in a state where the reference pin is inserted in the second through hole. Still alternatively, it is preferable that the wiring base includes a second through-hole different from the first through-holes into which the leading electrodes are inserted, and when a reference hole is provided in the laser holder and a reference pin which passes through the reference hole is provided in a jig used for holding the laser holder, the reference pin passes through the second through-holes. The first through-holes of the wiring base are located at positions corresponding to the through-holes of the insulator in a state where the reference pin is inserted in the second through hole and the reference hole.

With any of these structures of the present invention, the first through-holes of the wiring base and the through-holes of the insulator are positioned precisely so as to correspond to each other, and it is thus possible to prevent error when the leading electrodes of the semiconductor lasers are to be inserted into the through-holes of the insulator and breakage of the leading electrodes due to error in the insertion with greater certainty.

Preferably, the laser holder includes, on a surface opposite to a surface on which the receiving surfaces are formed, a cooling device-contacting portion whose protruding length is greater than portions of the respective leading electrodes of the plurality of the semiconductor lasers that protrude from the through-holes of the wiring base, and the heat-releasing surface is formed on an end of the cooling device-contacting portion, and contacts the heat-receiving surface of the cooling device in a state where the plurality of semiconductor lasers are attached to the laser holder via the insulator and the wiring base.

With this structure of the present invention, the heat-receiving surface can be formed flat, and therefore, the efficiency of cooling can be improved. In addition, the cost of producing the cooling device can be reduced.

Preferably, the cooling device includes recesses having such a depth that portions of the respective leading electrodes of the plurality of the semiconductor lasers that protrude from the through-holes of the wiring base can be inserted into the recesses without contact with the cooling device, and the heat-releasing surface formed on the surface of the laser holder opposite to the surface on which the receiving surfaces are formed contacts the heat-receiving surface of the cooling device in a state where the plurality of semiconductor lasers are attached to the laser holder via the insulator and the wiring base.

With this structure of the present invention, the size of the cooling device can be reduced, and as a result, the size of the laser array light source unit itself can also be reduced.

The present invention can provide a laser array light source unit having a structure that can efficiently release heat generated from semiconductor lasers, that can easily be built, and that can realize physical and electrical separation even when a plurality of semiconductor lasers are densely arranged. These and other objects, features, aspects, and effects of the present invention will become clearer on the basis of the following detailed description with reference to the accompanying drawings.

BRIEF DESCRIPTION OF THE DRAWINGS

FIG. 6C is a view of the laser array light source unit according to one embodiment (first embodiment) of the present invention cut along a B-B line shown in FIG. 6A;

DESCRIPTION OF THE PREFERRED EMBODIMENTS

First Embodiment

Figure 1:
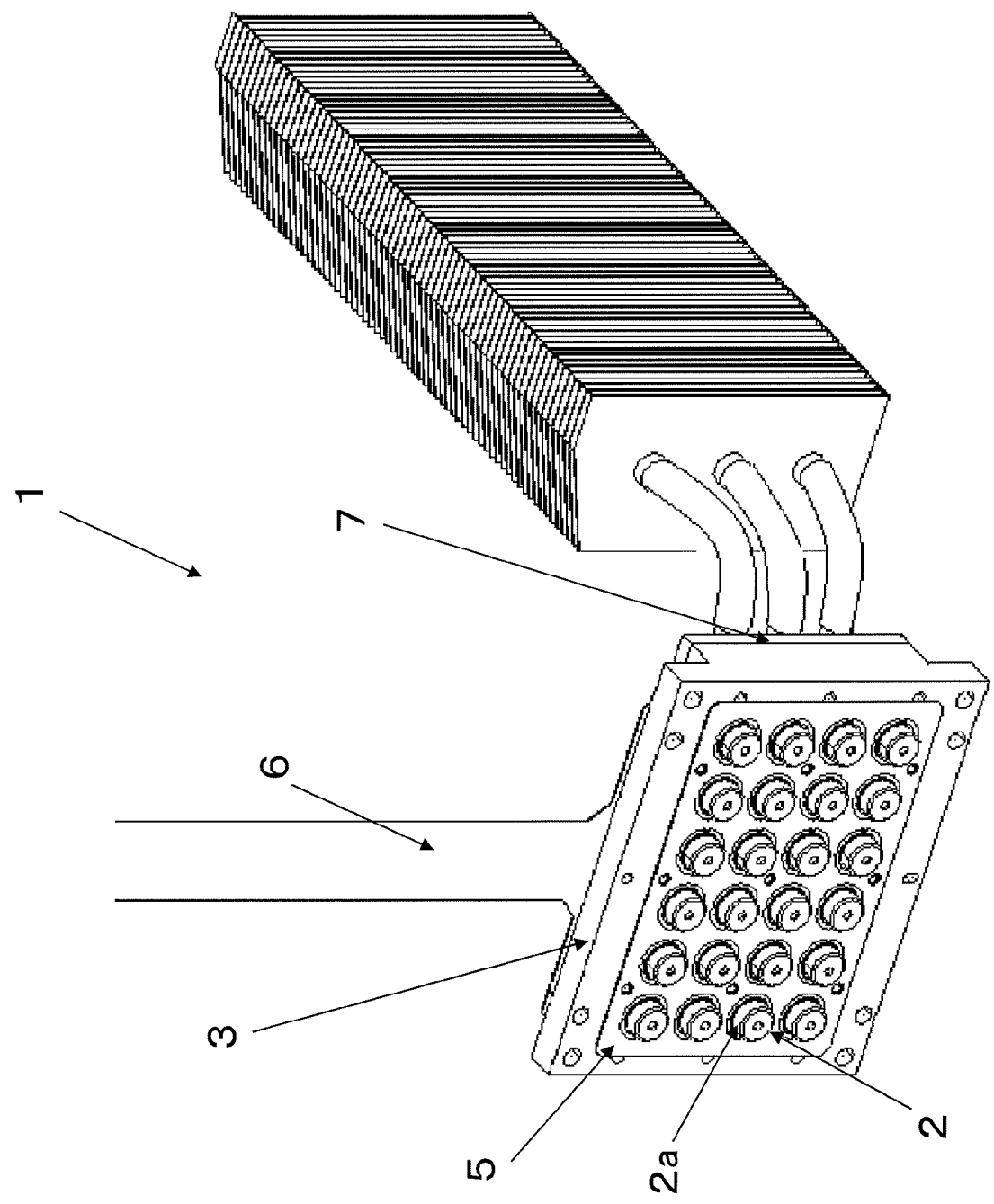
FIG. 1 illustrates a laser array light source unit according to one embodiment (first embodiment) of the present invention.
Figure 2:
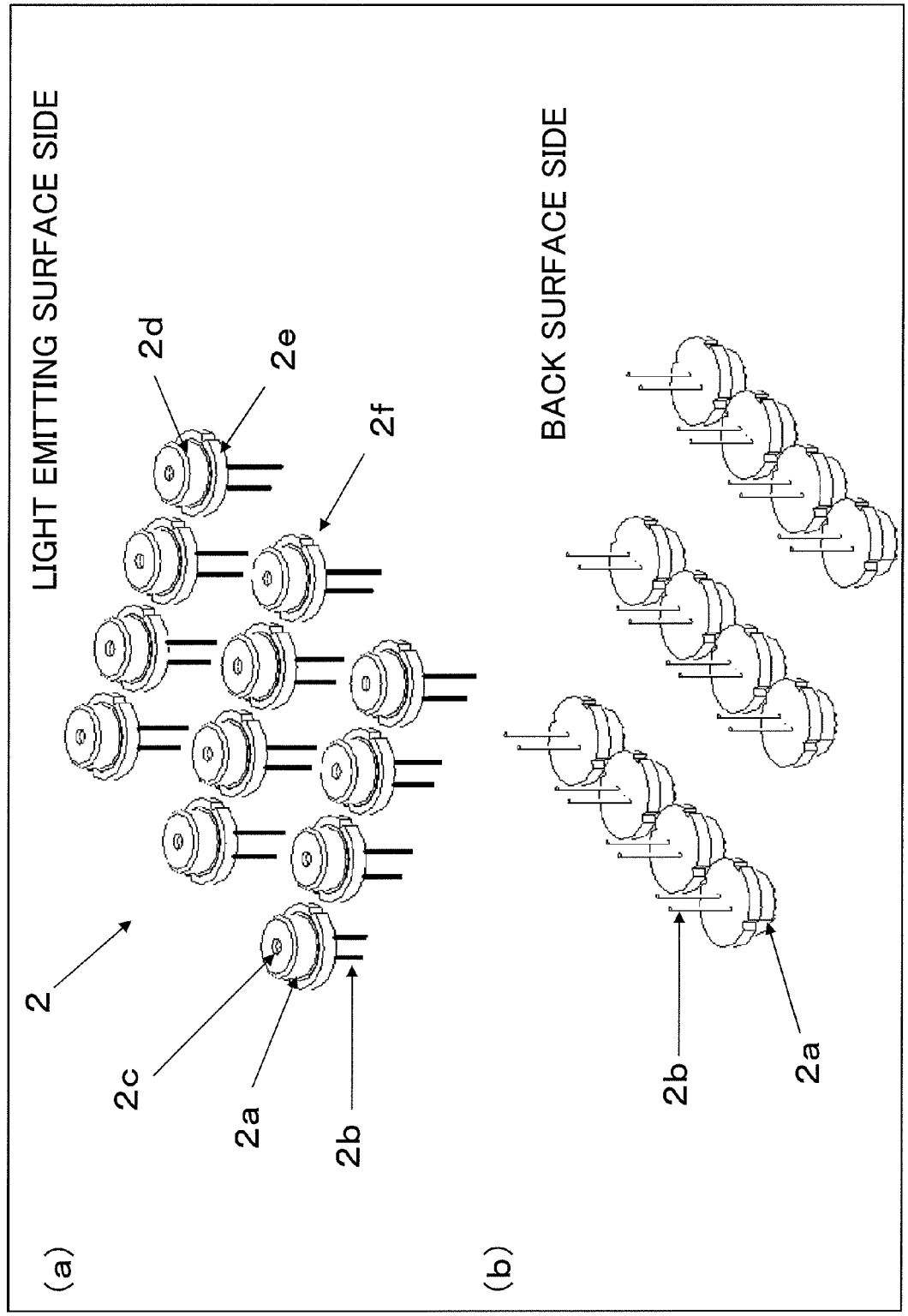
FIG. 2 illustrates semiconductor lasers according to one embodiment (first embodiment) of the present invention.
Figure 3:
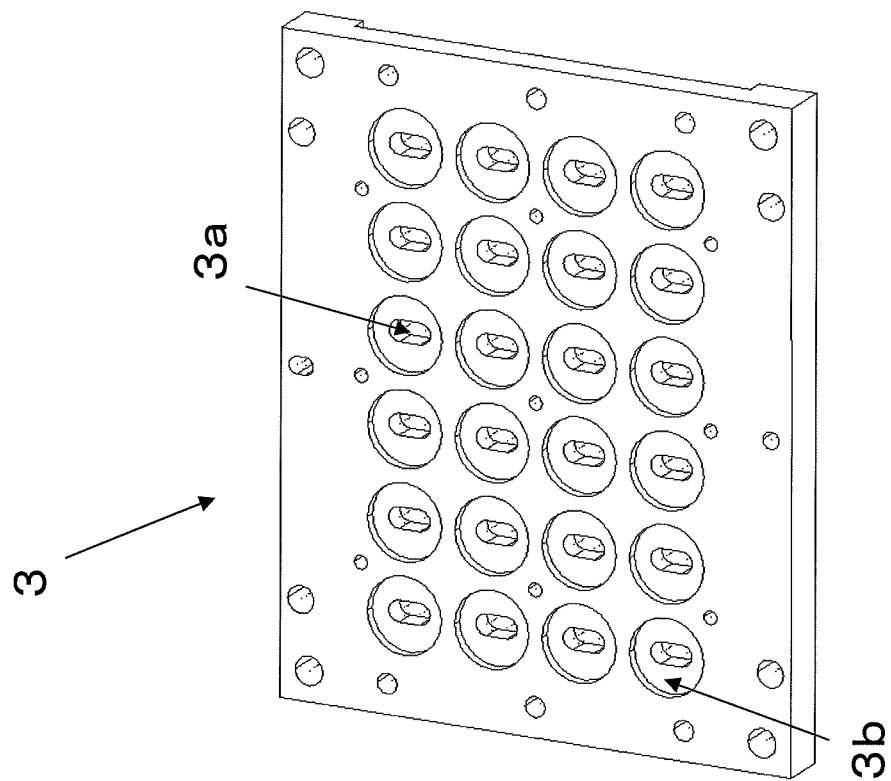
FIG. 3 illustrates a laser holder according to one embodiment (first embodiment) of the present invention.
Figure 4:
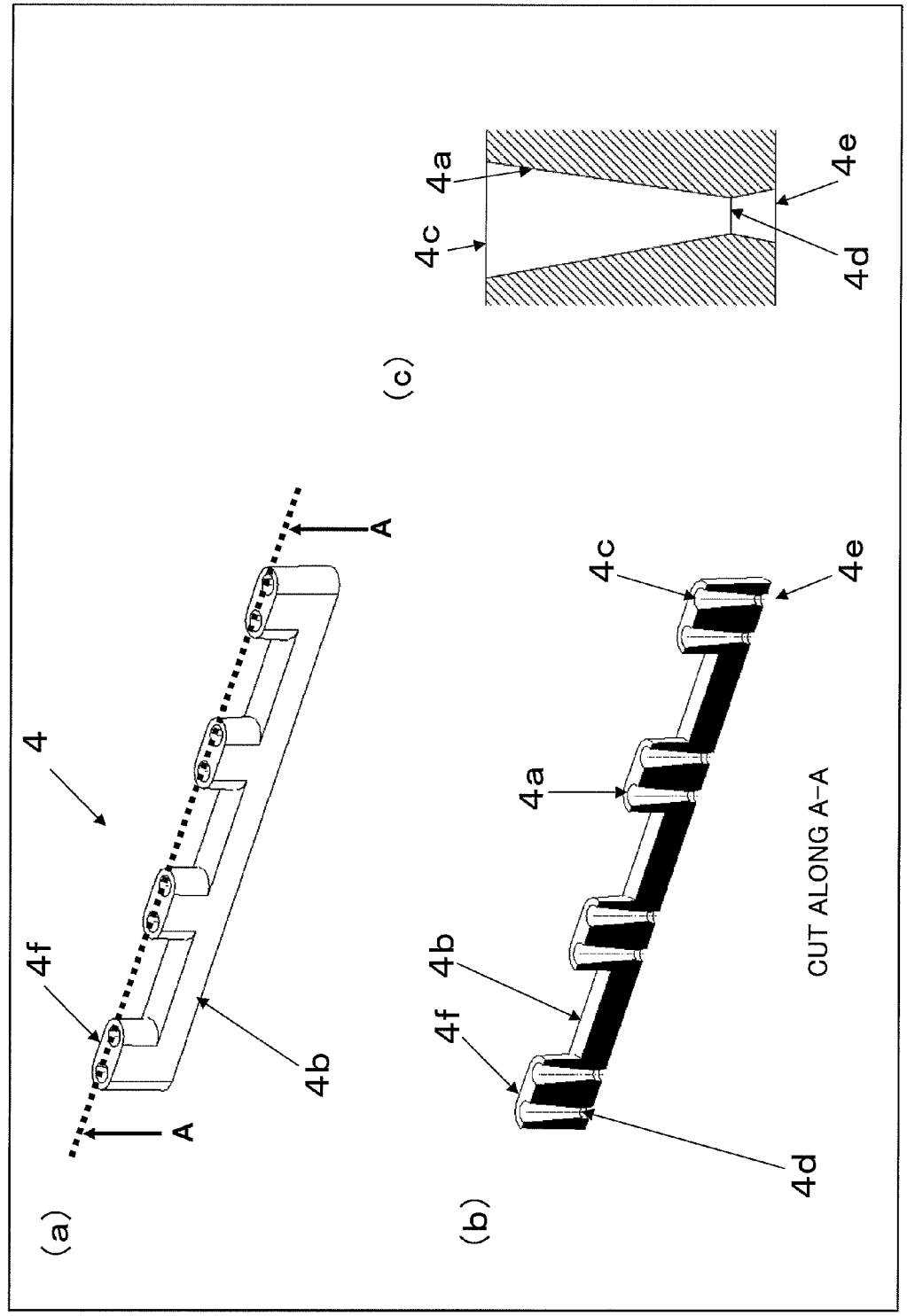
FIG. 4 illustrates an insulator according to one embodiment (first embodiment) of the present invention.

Hereinafter, a laser array light source unit 1 according to the present embodiment will be described with reference to the drawings. FIG. 1 illustrates the laser array light source unit 1 according to the present embodiment. FIG. 2 illustrates semiconductor lasers 2 according to the present embodiment. FIG. 2(a) is a perspective view of the semiconductor lasers 2 according to the present embodiment, as viewed from their light-emitting surface side, and FIG. 2(b) is a perspective view of the semiconductor lasers 2 according to the present embodiment, as viewed from their back surface side. FIG. 3 illustrates a laser holder 3 according to the present embodiment. FIG. 4 illustrates an insulator 4 according to the present embodiment. FIG. 4(a) is a perspective view of the insulator 4 according to the present embodiment, and FIG. 4(b) is a view of the insulator 4 cut along a A-A line shown in FIG. 4(a). FIG. 4(c) is an enlarged cross-sectional view of the through-hole 4a of the insulator 4 shown in FIG. 4(b).

As shown in FIG. 1, in the laser array light source unit 1, main body portions 2a of a plurality of the semiconductor lasers 2 are held with being pressed by a pressing member 5 toward the laser holder 3. Leg portions 2b of the semiconductor lasers 2 pass through through-holes 3a of the laser holder 3 toward its back surface side which is not shown in FIG. 1. The respective leading electrodes of the leg portions 2b having passed through the through-holes 3a of the laser holder 3 further pass through through-holes 4a of the insulator 4 into which the leading electrodes can be respectively inserted, and pass through first through-holes 6c provided in a wiring base 6. Each of the leading electrodes having passed through these components is soldered and fixed. Hereinafter, the components and arrangement thereof will be described.

<Semiconductor Laser>

The semiconductor laser 2 will be described. The semiconductor laser 2 functions as a light source in the laser array light source unit 1. As shown in FIG. 2(a) and FIG. 2(b), the semiconductor laser 2 includes a main body portion 2a and a leg portion 2b with two leading electrodes. The main body portion 2a includes a laser emitting portion 2C from which laser is emitted. The main body portion 2a is formed of a bulge portion 2d having the laser emitting portion 2C at its center, and a rim portion 2e formed around the bulge portion 2d. A cut 2f is formed in the rim portion 2e, and functions as a guide for inserting the leg portion 2b of the semiconductor laser 2 into a through-hole 3a of the laser holder 3 described below. The rim portion 2e is brought into contact with the pressing member 5, and thus the semiconductor laser 2 is pressed by the pressing member 5 toward the laser holder 3. As shown in FIG. 2, the leg portion 2b with two leading electrodes is provided at the back surface of the semiconductor laser 2. When a plurality of the semiconductor lasers 2 are arranged in one line, or in rows and columns, the leading electrodes are placed such that an anode of one semiconductor laser 2 and a cathode of another adjacent semiconductor laser 2 are located side by side. This placement allows the semiconductor lasers 2 to be connected electrically in series when the respective leading electrodes of the semiconductor lasers are connected to the wiring base 6 described below.

The diameter of the leading electrodes varies depending on the type of the semiconductor laser 2, and cannot be definitely determined. In the present embodiment, the diameter may be 0.45±0.10 mm, and an anode and a cathode of the leading electrodes of each semiconductor laser 2 are spaced from each other by about 2.54 mm.

<Laser Holder>

The laser holder 3 will be described. The laser holder 3 functions as a holder for the semiconductor lasers 2. As shown in FIG. 3, the laser holder 3 has receiving surfaces 3b for holding the semiconductor lasers 2, and the back surfaces of the main body portions 2a of the semiconductor lasers 2 contact the receiving surfaces 3b. Each of the receiving surfaces 3b has, approximately at its center, a through-hole 3a into which the leg portion 2b of the semiconductor laser 2 can be inserted. The receiving surfaces 3b and the through-holes 3a of the laser holder 3 are provided in accordance with the number and arrangement of the semiconductor lasers 2 to be used. In FIG. 3, each of the numbers of the receiving surfaces 3b and the through-holes 3a is 24 in total on the assumption that the number of the semiconductor lasers 2 to be used is 4×6.

The receiving surfaces 3b contact the main body portions 2a of the semiconductor lasers 2, and thus can propagate heat generated from the semiconductor lasers 2. In view of this, the receiving surfaces 3b are formed from a material with high thermal conductivity. In the present embodiment, the receiving surfaces 3b of the laser holder 3 are made of aluminum.

The shape of the through-holes 3a is not particularly limited. Preferably, when the leading electrodes of the semiconductor lasers 2 are respectively inserted into the through-holes 3a adjacent to each other, the anodes and cathodes of the leading electrodes are aligned in line after the insertion. Therefore, the cross-sectional shape of the through-holes 3a is preferably a rounded-corner rectangle as shown in FIG. 3, for example.

<Insulator>

The insulator 4 will be described. In general, each of the leading electrodes of the leg portions 2b is long enough to be connected to the wiring base 6 described below after the leg portions 2b of the semiconductor lasers 2 are inserted into and passed through the through-holes 3a of the laser holder 3. In this case, there is a possibility that the leading electrodes short out by contacting each other physically and electrically. Therefore, the insulator 4 including a plurality of electrode insertion portions 4f having through-holes 4a into which the leading electrodes are respectively inserted is used, and the through holes 4a are provided so as to prevent the leading electrodes from contacting each other physically and electrically.

As shown in FIG. 4(b), the insulator 4 includes the through-holes 4a into which the leading electrodes are respectively inserted. An electrode insertion portion 4f having through-holes 4a through which two leading electrodes of one semiconductor laser 2 pass, and an electrode insertion portion 4f having through-holes 4a through which two leading electrodes of another adjacent semiconductor laser 2 pass, are connected by a connecting portion 4b. The connecting portions 4b are formed so as to extend in the same direction in which the plurality of semiconductor lasers 2 are arranged. Connecting the through-holes 4a in one line by means of the connecting portions 4b in this manner makes positioning of the insulator easier than when a plurality of insulators corresponding respectively to the plurality of semiconductor lasers 2 are prepared, thereby promoting the efficiency of production operations. The shape of the connecting portions 4b is not particularly limited. Preferably, the connecting portions 4b have a surface formed in the same plane in which leading electrode outlets 4e lie, as shown in FIG. 4(b). In such a structure, the connecting portions 4b are located along the wiring base 6 described below, and therefore, do not narrow a space used for heat release in the laser array light source unit 1. This enables securement of a sufficient space for efficiently releasing heat generated from the semiconductor lasers 2.

Any material that has insulating properties can be used for the insulator 4 without particular limitation. The insulator 4 used in the present embodiment is made of a polyphenylene sulfide (PPS) resin excellent in heat resistance, chemical resistance, and precision-formability.

As shown in FIG. 4(b), the through-hole 4a of the insulator 4 has a leading electrode inlet 4c into which a leading electrode is inserted, a small-diameter portion 4d formed by tapering the diameter of the through-hole 4a along the insertion direction, and a leading electrode outlet 4e formed by gradually expanding the diameter of the through-hole 4a from the small-diameter portion 4d. Since the through-hole 4a has a portion whose diameter is tapered along the direction of insertion of the leading electrodes as described above, when the laser array light source unit 1 is to be built, the leading electrodes can easily be inserted into the through-holes 4a, and therefore, error in the insertion and breakage of the leading electrodes due to error in the insertion can be prevented. In addition, since the small-diameter portion 4d is provided, the leading electrodes can be held in contact with the small-diameter portion 4d, and thus the positions of the semiconductor lasers 2 inserted in the laser holder 3 can be fixed with improved precision, and further, the leading electrodes can be separated from each other physically and electrically with greater certainty. In addition, since the diameter of the through-hole 4a is gradually expanded from the small-diameter portion 4d toward the leading electrode outlet 4e, a solder applied when soldering is performed can enter the portion whose diameter is gradually expanded, and thus poor soldering can be prevented. The diameter of the leading electrode inlet 4c is not particularly limited. In the case where the diameter of the leading electrodes of the semiconductor lasers 2 is 0.45±0.10 mm, and the anode and cathode of the leading electrodes of each semiconductor laser 2 are spaced by about 2.54 mm, the diameter of the leading electrode inlet 4c is, for example, about 1.4 mm. In the same case, the diameter of the leading electrode outlet 4e is, for example, about 0.9 mm, and the diameter of the small-diameter portion 4d is, for example, about 0.70 mm.

<Wiring base>

The wiring base 6 will be described. The wiring base 6 is a base for electrically connecting the semiconductor lasers 2 in series. The material of the wiring base 6 is not particularly limited, and a flexible printed substrate can be used. Well-known materials can be used for an insulating portion 6a (base film) and a conducting portion 6b which are included in the flexible printed substrate. For example, polyimide can be used for the insulating portion 6a, and copper can be used for the conducting portion 6b.

Figure 5:
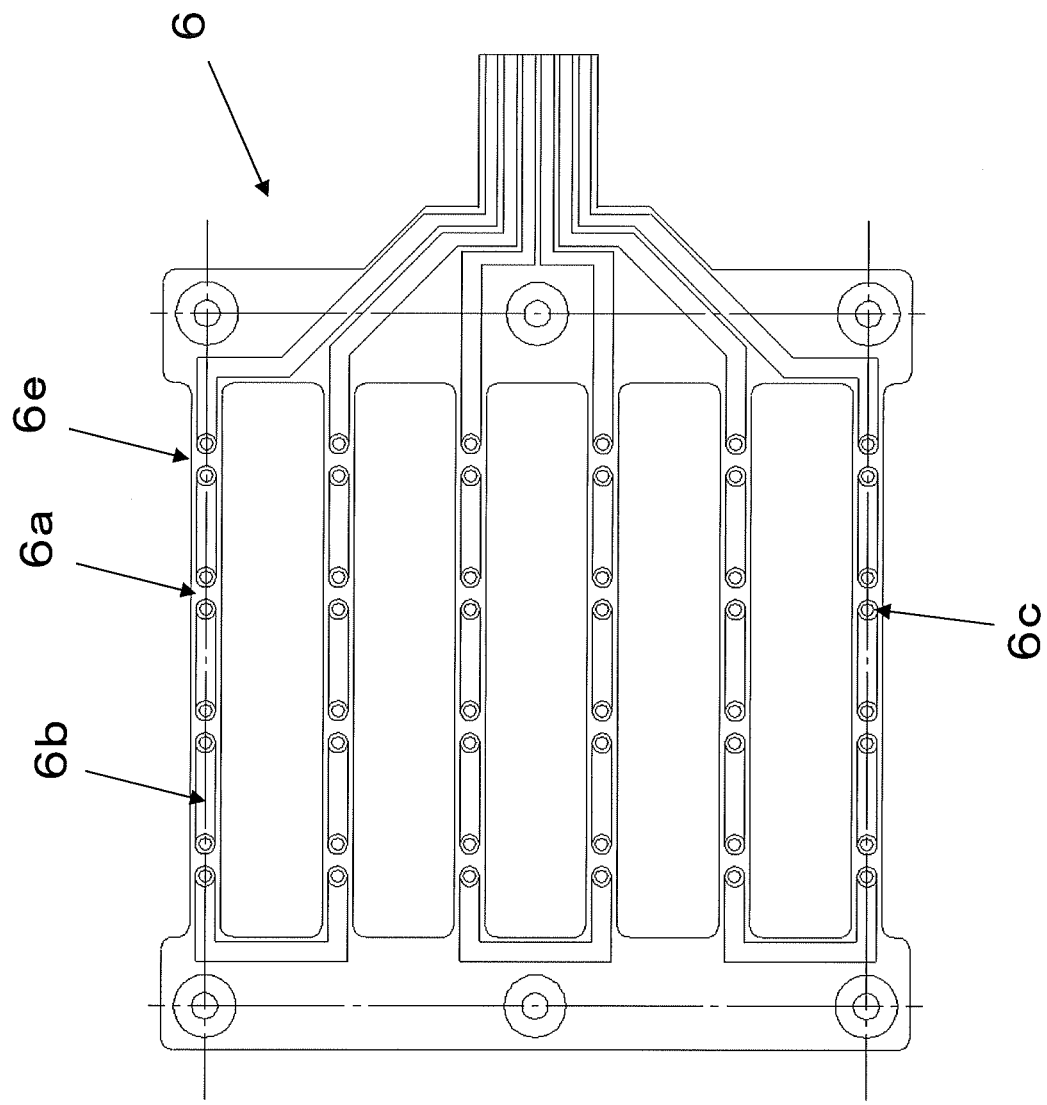
FIG. 5 illustrates a wiring base according to one embodiment (first embodiment) of the present invention.

FIG. 5 illustrates the wiring base 6 according to the present embodiment. As shown in FIG. 5, the wiring base 6 includes the insulating portion 6a and the conducting portion 6b. The conducting portion 6b includes first through-holes 6c for anodes of the leading electrodes and first through-holes 6c for cathodes of the leading electrodes, and the leading electrodes of the semiconductor lasers 2 are inserted into the first through-holes 6c such that an anode of the leading electrodes of one semiconductor laser 2 and a cathode of the leading electrodes of another adjacent semiconductor laser 2 are electrically connected.

FIG. 5 shows the structure of the conducting portion 6b of the wiring base 6 in the case where six rows each consisting of four semiconductor lasers 2 arranged side by side are formed. Four adjacent semiconductor lasers 2 form one row, and two rows adjacent to each other are electrically connected in series. Due to this structure of the wiring base 6, the connecting portions 4b of the insulator 4 and the conducting portion 6b are located so as to overlap each other. As a result, the wiring base 6 is laid under the insulator 4 within the laser array light source unit 1, and therefore, a sufficient space for efficiently releasing heat generated from the semiconductor lasers 2 can be secured.

The first through-holes 6c of the wiring base 6 are preferably formed so as to have a diameter larger than that of the small-diameter portions 4d of the insulator 4 so that the respective leading electrodes of the semiconductor lasers 2 having passed through the through-holes 4a of the insulator 4 can easily be inserted into the first through-holes 6c. In addition, the diameter of the first through-holes 6c is preferably almost equal to the sum of the diameter of the leading electrodes and a difference between the diameter of the first through-holes 6c and the diameter of the leading electrodes (a value twice an insertion allowance when the leading electrode is inserted into the first through-hole 6c). If the first holes 6c are formed so as to have such a diameter, the respective leading electrodes of the semiconductor lasers 2 having passed through the through-holes 4a of the insulator 4 can easily pass through the first through-holes 6c of the wiring base, and poor soldering can be prevented. To be specific, the diameter of the first through-holes 6c is about 0.95 mm in the case where, for example, the diameter of the leading electrodes of the semiconductor lasers 2 is 0.45±0.10 mm, and the insertion allowance when a leading electrode is inserted into a first through-hole 6c is about 0.25 mm.

In the wiring base 6, the width of a row wiring portion 6e provided for each row of the semiconductor lasers is preferably almost equal to the sum of the diameter of the first through-holes 6c, a value twice the width of soldering pattern formed by soldering, and a value twice an allowance of the row wiring portion 6e in the width direction, and is preferably almost equal to the width of the insulator 4. If the row wiring portion 6e of the wiring base 6 is formed so as to have such a width, the row wiring portion 6e of the wiring base 6 is located at a position overlapping a position at which the insulator 4 is located. This prevents the wiring base 6 from excessively occupying a space used for releasing heat of the laser array light source unit 1, thereby enabling securement of a sufficient space for efficiently releasing heat generated from the semiconductor lasers 2. To be specific, the width of the row wiring portion 6e of the wiring base 6 is about 2.4 mm in the case where, for example, the diameter of the first through-holes 6c is about 0.95 mm, the allowance of the row wiring portion 6e is about 0.4 mm, and the width of the soldering pattern is about 0.3 mm. In this case, since the width of the row wiring portion 6e is almost equal to the width of the insulator 4, the width of the insulator 4 is also about 2.4 mm.

<Pressing Member>

The pressing member 5 will be described. The pressing member 5 is a member for pressing the main body portions 2a of the semiconductor lasers 2 such that the main body portions 2a contact the receiving surfaces 3b of the laser holder 3. As shown in FIG. 1, FIGS. 6A to 6C, and FIG. 7A, the through-holes 5a of the pressing member 5 have a diameter larger than that of the bulge portions 2d of the semiconductor lasers 2 and smaller than that of the rim portions 2e of the semiconductor lasers 2. Therefore, when the bulge portions 2d of the semiconductor lasers 2 are inserted into the through-holes 5a of the pressing member 5 and the main body portions 2a of the semiconductor lasers 2 are pressed toward the laser holder 3, heat generated from the semiconductor lasers 2 is released. The pressing member 5 is fixed to the laser holder 3 by tightening screws into screw holes of the laser holder 3.

The material of the pressing member 5 is not particularly limited. In view of holding ability and heat releasing properties, the pressing member 5 used in the laser array light source unit 1 shown in FIG. 1 is made of stainless steel and has elasticity. After the semiconductor lasers 2 are pressed against the laser holder 3 by the pressing member 5 functioning as a plate spring, the respective leading electrodes of the semiconductor lasers 2 are fixed to the wiring base 6 by soldering.

<Cooling Device>

A cooling device 7 will be described. When the laser array light source unit 1 according to the present invention is used, the cooling device 7 is provided as an auxiliary component in order to enhance the efficiency of releasing heat generated from each of the semiconductor lasers 2.

The type of the cooling device 7 is not particularly limited, and cooling devices adopting various types of cooling methods, such as cooling by wind, cooling by gas, cooling by phase change, and cooling by liquid, can be used. As shown in FIG. 1, the cooling device 7 used in the present embodiment includes heat pipes made of copper.

The place in which the cooling device 7 (heat radiator or heat sink) is installed is not particularly limited. For example, a cooling device using wind may be placed diagonally in front of the semiconductor lasers 2 in such a manner that the path of laser emitted from the laser emitting portions 2c of the semiconductor lasers 2 is not obstructed. The cooling device 7 may be brought into contact with the back surface (opposite to the surface on which the receiving surfaces 3b are formed) of the laser holder 3 as shown in FIG. 1.

The positional relationship between the laser holder 3 and the cooling device 7 will be described. The back surface of the laser holder 3 and the cooling device 7 are in contact with each other. That is, the back surface of the laser holder 3 functions as a heat-releasing surface for releasing heat generated from the semiconductor lasers 2. On the other hand, the surface of the cooling device 7 that contacts the heat-releasing surface of the laser holder 3 functions as a heat-receiving surface. Examples of such a structure in which the heat-releasing surface and the heat-receiving surface are in contact with each other include those described below.

Figure 6A:
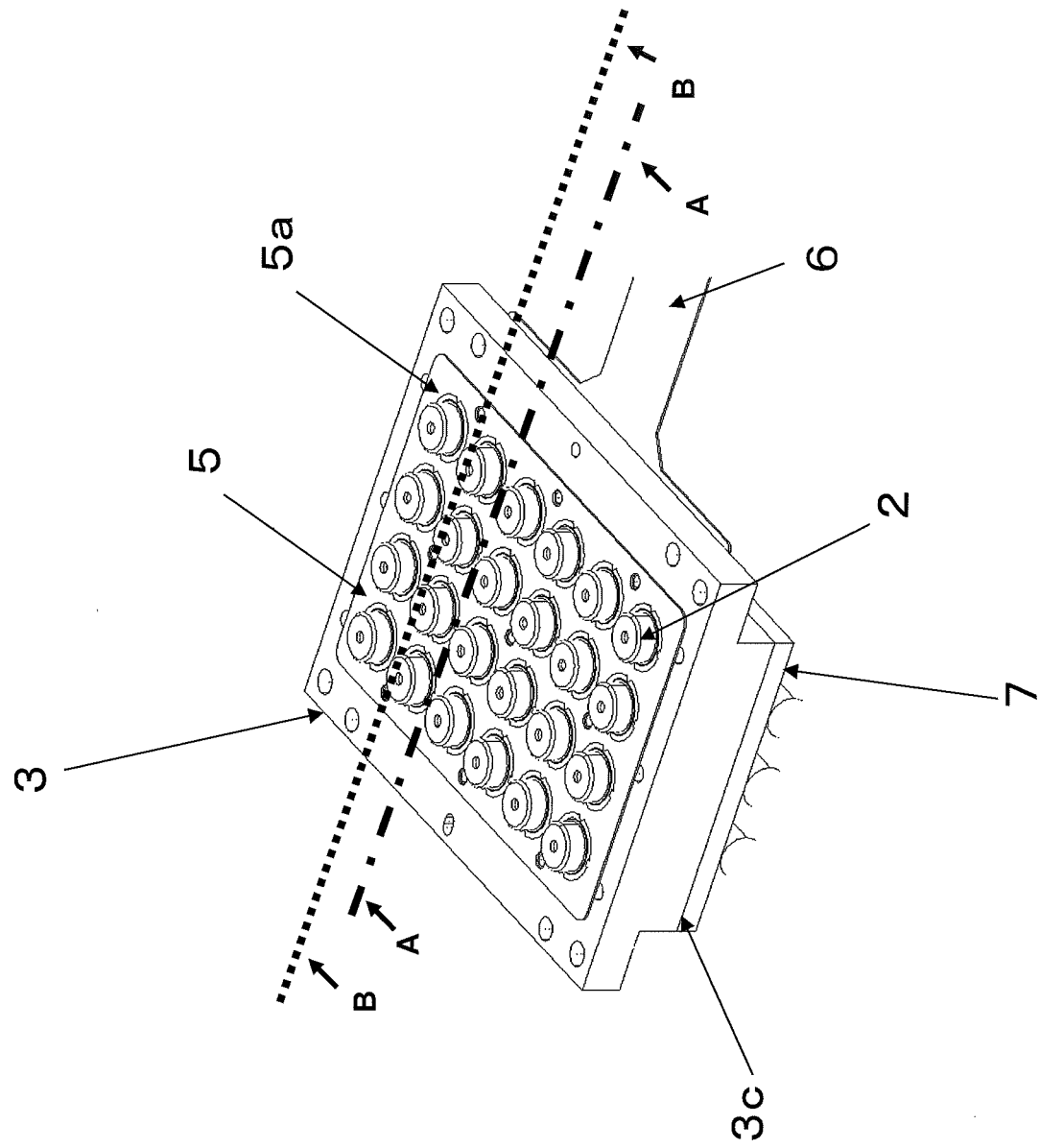
FIG. 6A is an overall view of the laser array light source unit according to one embodiment (first embodiment) of the present invention.
Figure 6B:
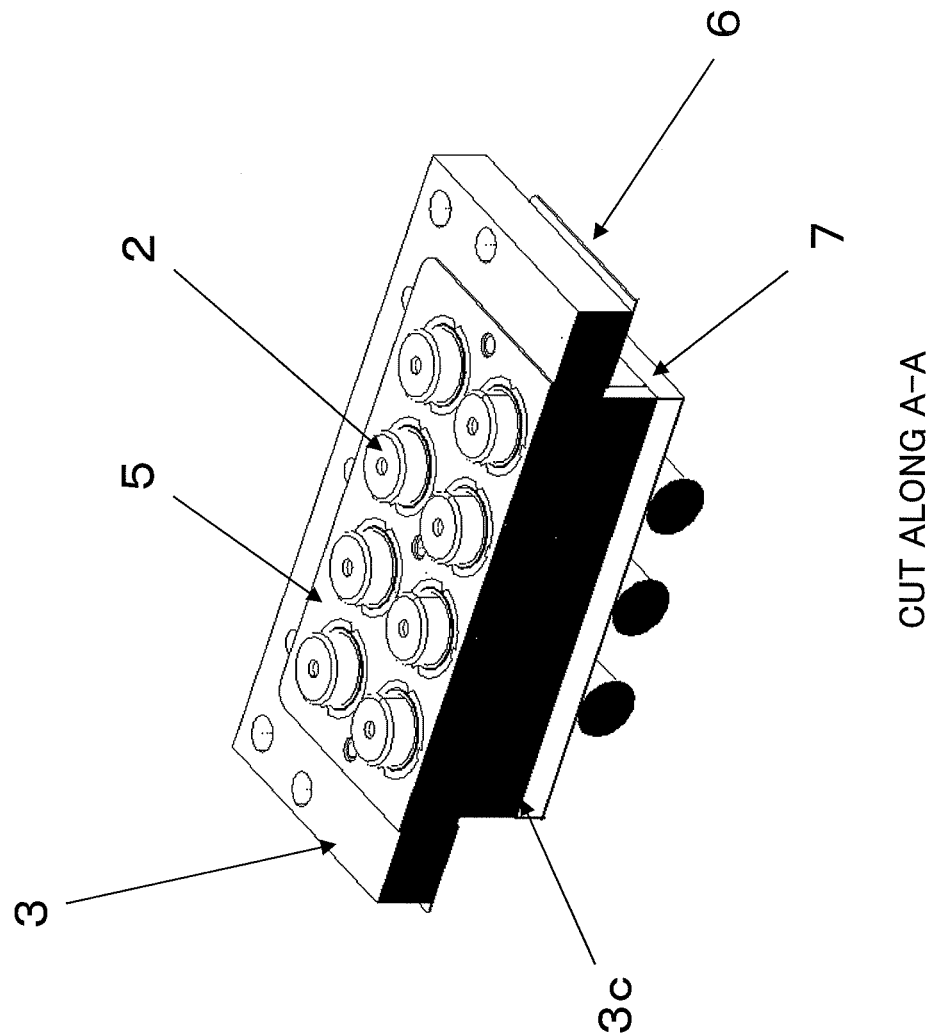
FIG. 6B is a view of the laser array light source unit according to one embodiment (first embodiment) of the present invention cut along a A-A line shown in FIG. 6A.
Figure 6D:
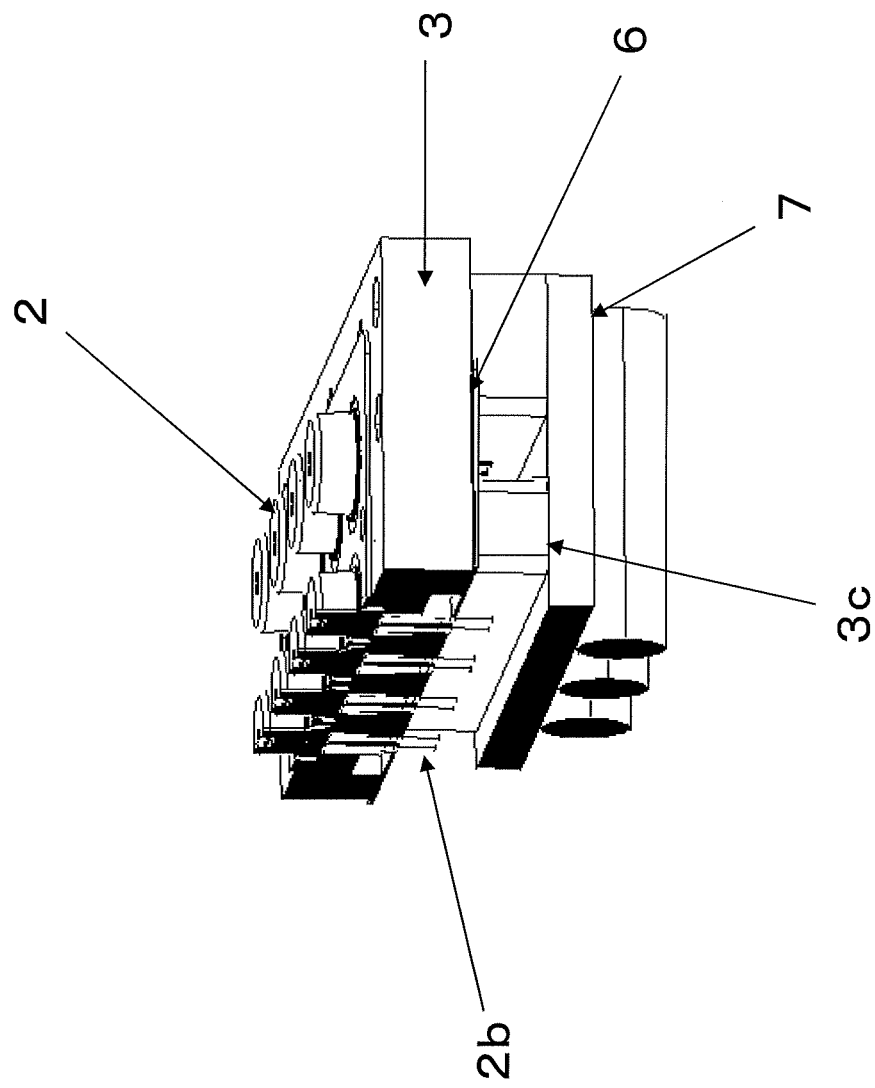
FIG. 6D is a view of the laser array light source unit according to one embodiment (first embodiment) of the present invention cut along the B-B line shown in FIG. 6A.

A first mode is shown in FIG. 6A to FIG. 6D. FIG. 6A to FIG. 6D illustrate a state in which the laser holder 3 and the cooling device 7 are in contact with each other. FIG. 6A is an overall view of the laser array light source unit 1, FIG. 6B is a view of the laser array light source unit 1 cut along a A-A line shown in FIG. 6A, FIG. 6C is a view of the laser array light source unit 1 cut along a B-B line shown in FIG. 6A, and FIG. 6D shows the view of FIG. 6C as viewed approximately from the lateral surface side. As shown in FIGS. 6B to 6D, the back surface of the laser holder 3 has a cooling device-contacting portion 3c whose protruding length is greater than the portions of the leading electrodes that protrude from the first through-holes 6c of the wiring base 6 in a state where the semiconductor lasers 2 are attached to the laser holder 3 via the insulator 4 and the wiring base 6. The cooling device-contacting portion 3c protrudes from the back surface of the laser holder 3 and passes through between the row wiring portions 6e of the wiring base 6. The protruding length of the cooling device-contacting portion 3C from the back surface of the wiring base 6 is greater than the protruding length of the leading electrodes from the back surface of the wiring base 6. An end of the cooling device-contacting portion 3c acts as the heat-releasing surface, and is in contact with the heat-receiving surface of the cooling device 7. Thus, in the first mode, the heat-receiving surface of the cooling device 7 can be formed flat, and therefore, the efficiency of cooling can be improved. In addition, since the structure of the heat-receiving surface of the cooling device 7 is simple, the production cost can be reduced.

Figure 7A:
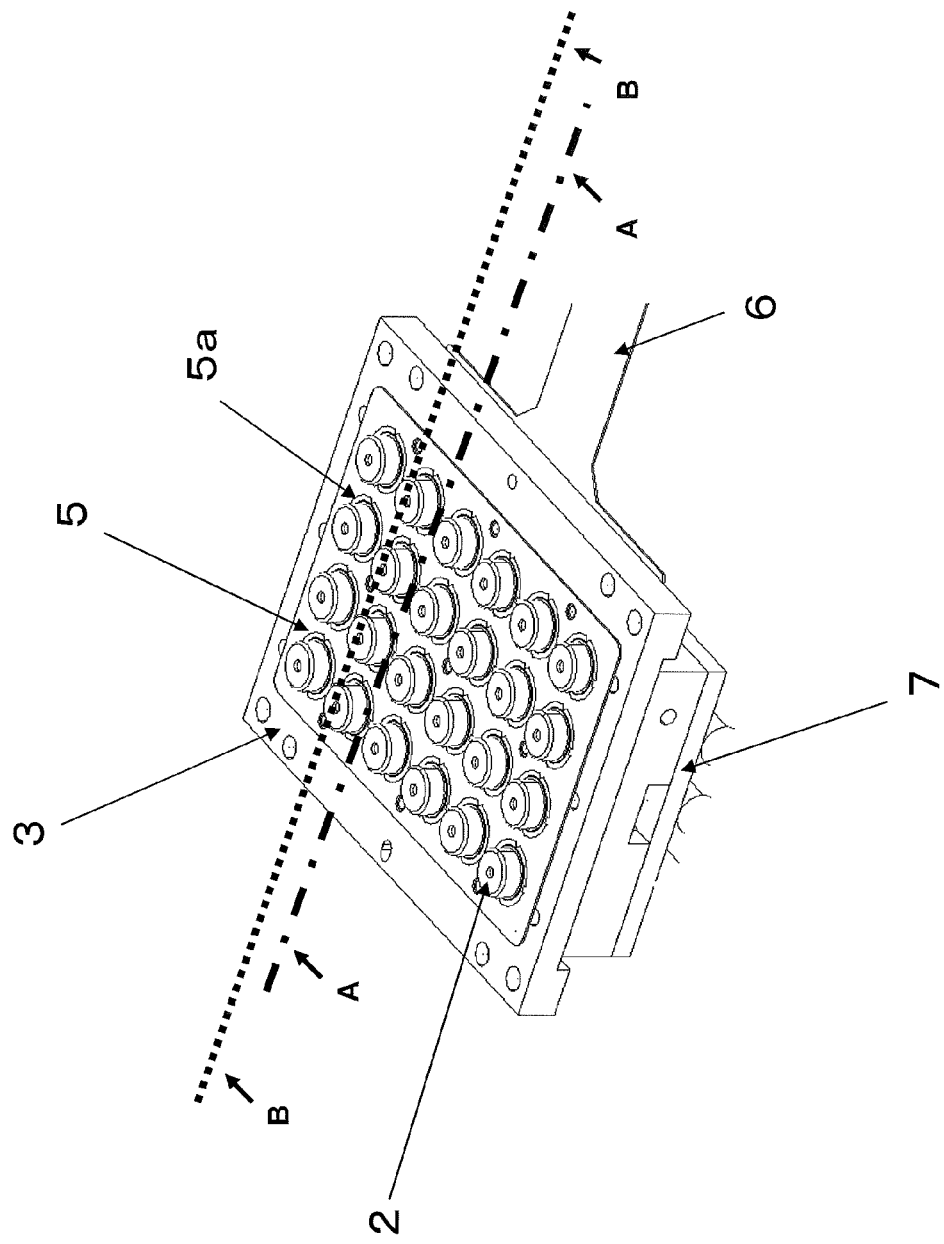
FIG. 7A is an overall view of the laser array light source unit according to one embodiment (first embodiment) of the present invention.
Figure 7B:
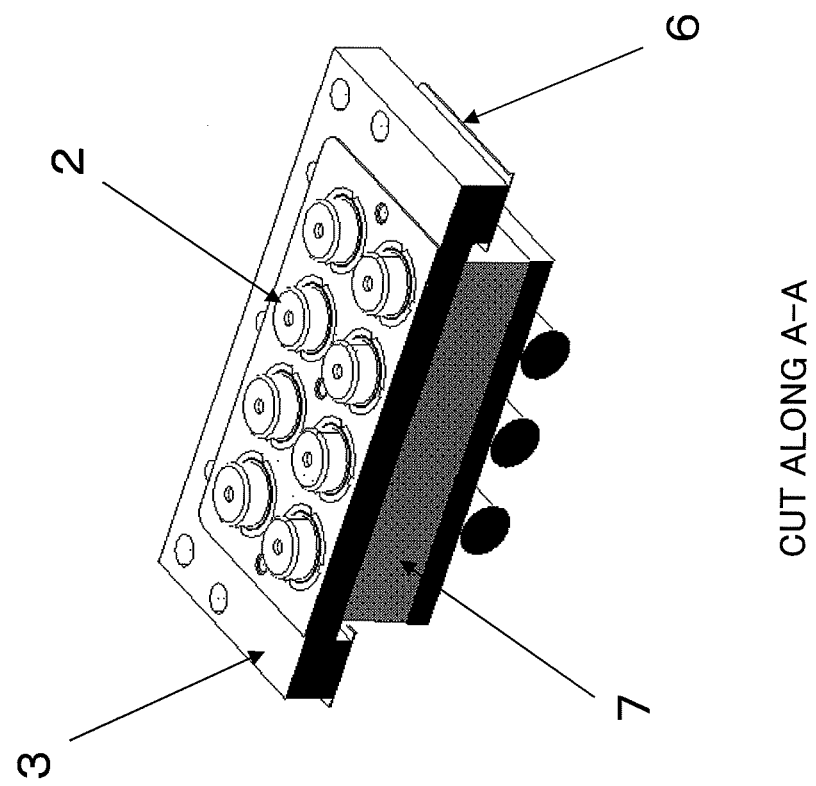
FIG. 7B is a view of the laser array light source unit according to one embodiment (first embodiment) of the present invention cut along a A-A line shown in FIG. 7A.
Figure 7C:
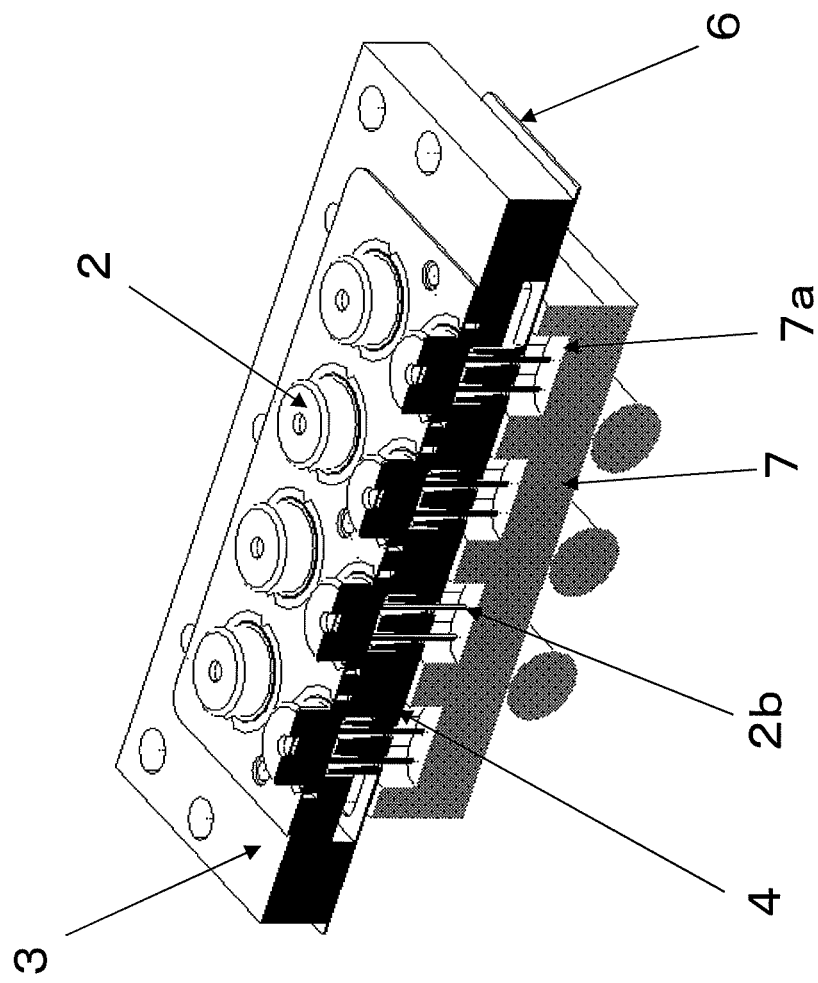
FIG. 7C is a view of the laser array light source unit according to one embodiment (first embodiment) of the present invention cut along a B-B line shown in FIG. 7A.

A second mode is shown in FIG. 7A to FIG. 7C. FIG. 7A to FIG. 7C illustrate a state in which the laser holder 3 and the cooling device 7 are in contact with each other. FIG. 7A is an overall view of the laser array light source unit 1, FIG. 7B is a view of the laser array light source unit 1 cut along a A-A line shown in FIG. 7A, and FIG. 7C is a view of the laser array light source unit 1 cut along a B-B line shown in FIG. 7A. As shown in FIG. 7B and FIG. 7C, in a state where the semiconductor lasers 2 are attached to the laser holder 3 via the insulator 4 and the wiring base 6, the portions of the leading electrodes that protrude from the back surface of the laser holder 3 are inserted into recesses 7a provided in the cooling device 7. The recesses 7a are formed so as to have such a depth that the leading electrodes can be inserted without contact with the cooling device 7. The back surface of the laser holder 3 acts as the heat-releasing surface, and is in contact with the heat-receiving surface of the cooling device 7. As is clear from the comparison with the first mode shown in FIG. 6C and FIG. 6D, the size of the cooling device 7 can be reduced by providing the recesses 7a in the cooling device 7 in the above manner. This can result in reduction of the size of the laser array light source unit itself.

Second Embodiment

Figure 8:
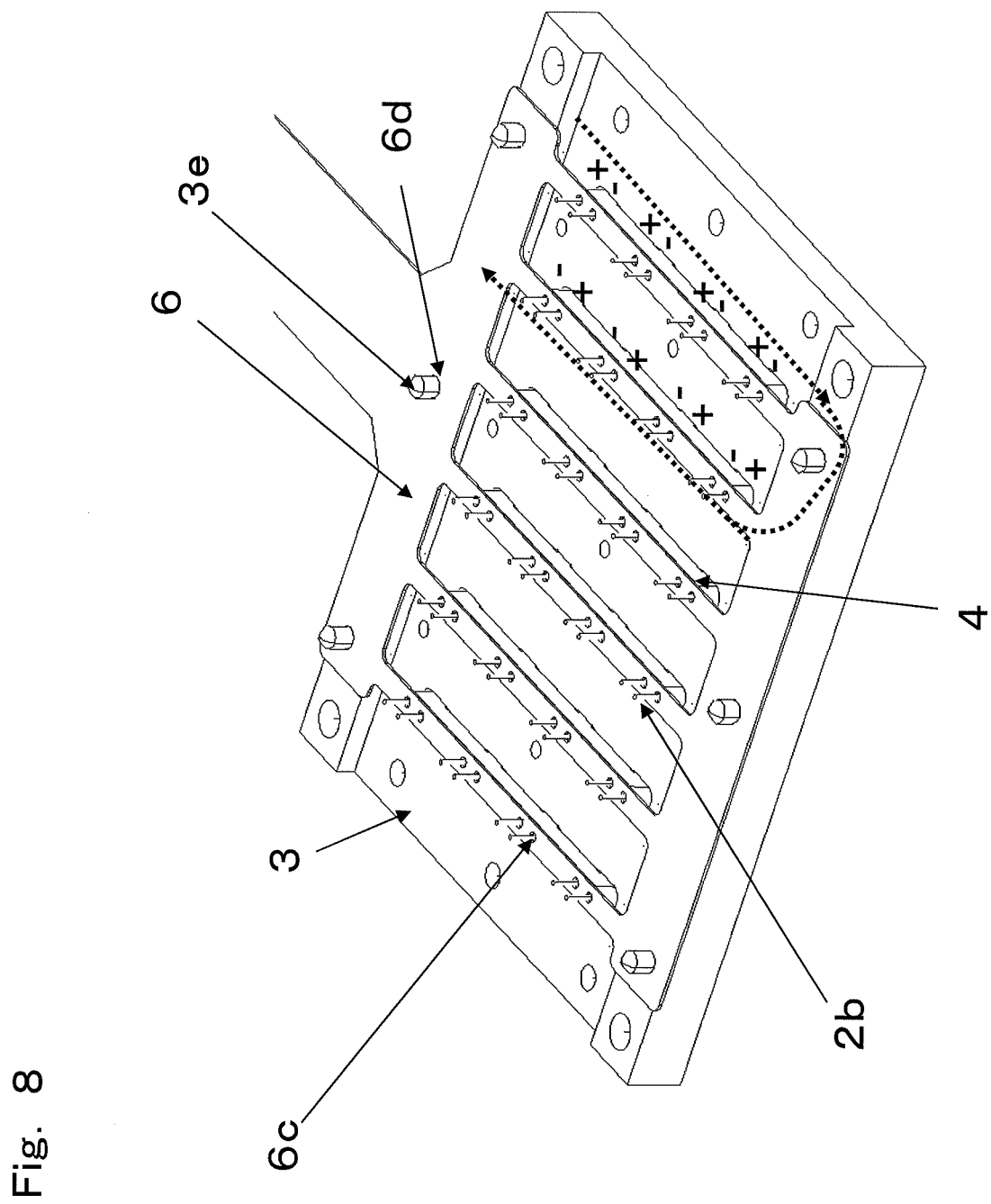
FIG. 8 illustrates positions of a wiring base and a laser holder according to one embodiment (second embodiment) of the present invention.

A structure of a laser array light source unit according to the present embodiment will be described with reference to FIG. 8. FIG. 8 illustrates positions of a wiring base 6 and a laser holder 3 according to the present embodiment. As shown in FIG. 8, the wiring base 6 has second through-holes 6d different from first through-holes 6c into which leading electrodes are inserted. Reference pins 3e provided in the laser holder 3 pass through the second through-holes 6d. The first through-holes 6c of the wiring base 6 are located so as to correspond to through-holes 4a of the insulator 4 in a state where the reference pins 3e have passed through the second through-holes 6d. Components other than these can be the same as described in the first embodiment, and thus are denoted by the same reference characters, and the description thereof is omitted.

By passing the reference pins 3e of the laser holder 3 through the second through-holes 6d provided in the wiring base 6 as described above, the first through-holes 6c and the through-holes 4a of the insulator 4 are necessarily positioned so as to correspond to each other. This can ensure prevention of error when the leading electrodes of the semiconductor lasers 2 are to be inserted into the through-holes 4a of the insulator 4 and prevention of breakage of the leading electrodes due to error in the insertion.

Third Embodiment

Figure 9A:
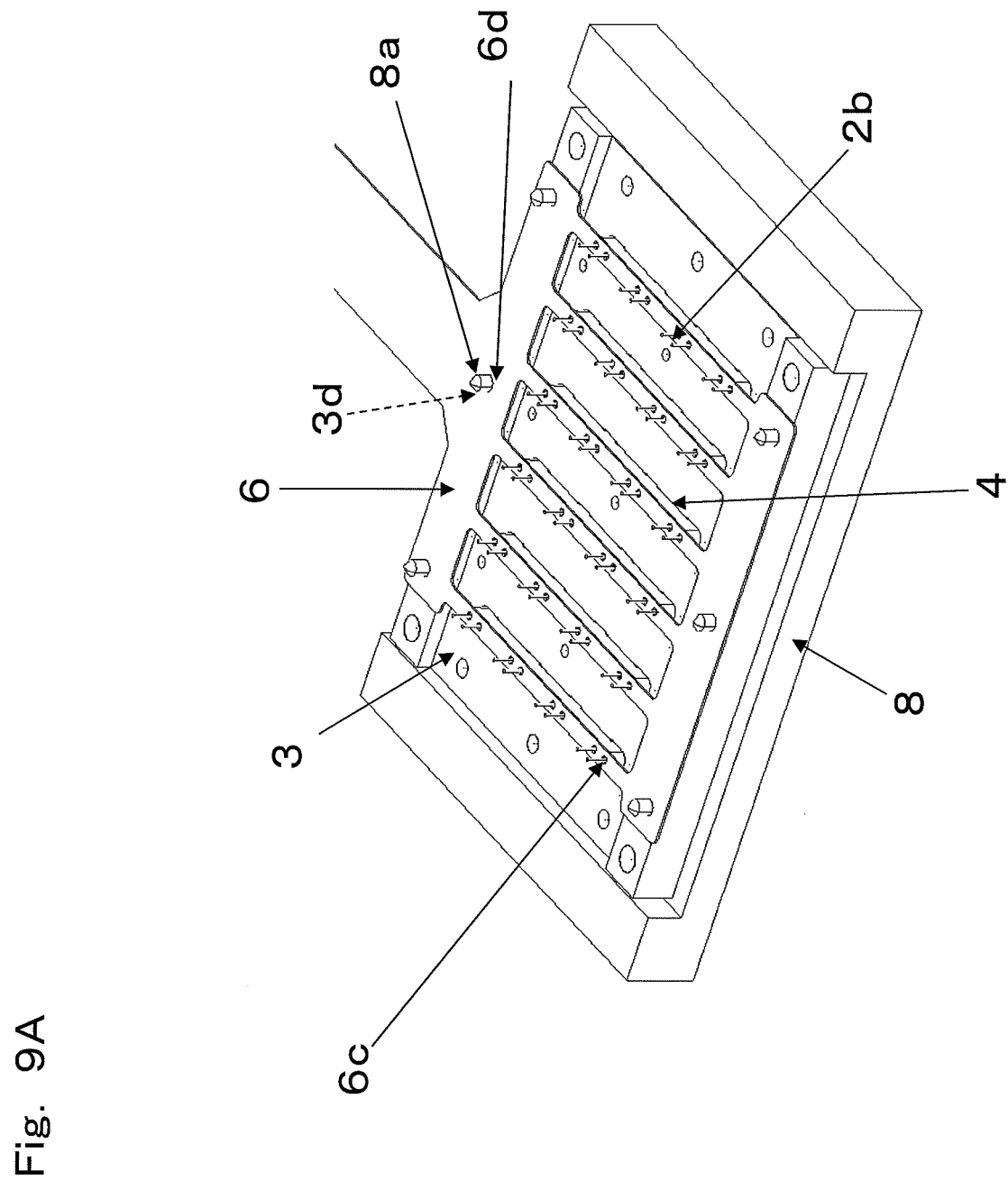
FIG. 9A illustrates positions of a wiring base, a laser holder, and a jig according to one embodiment (third embodiment) of the present invention.
Figure 9B:
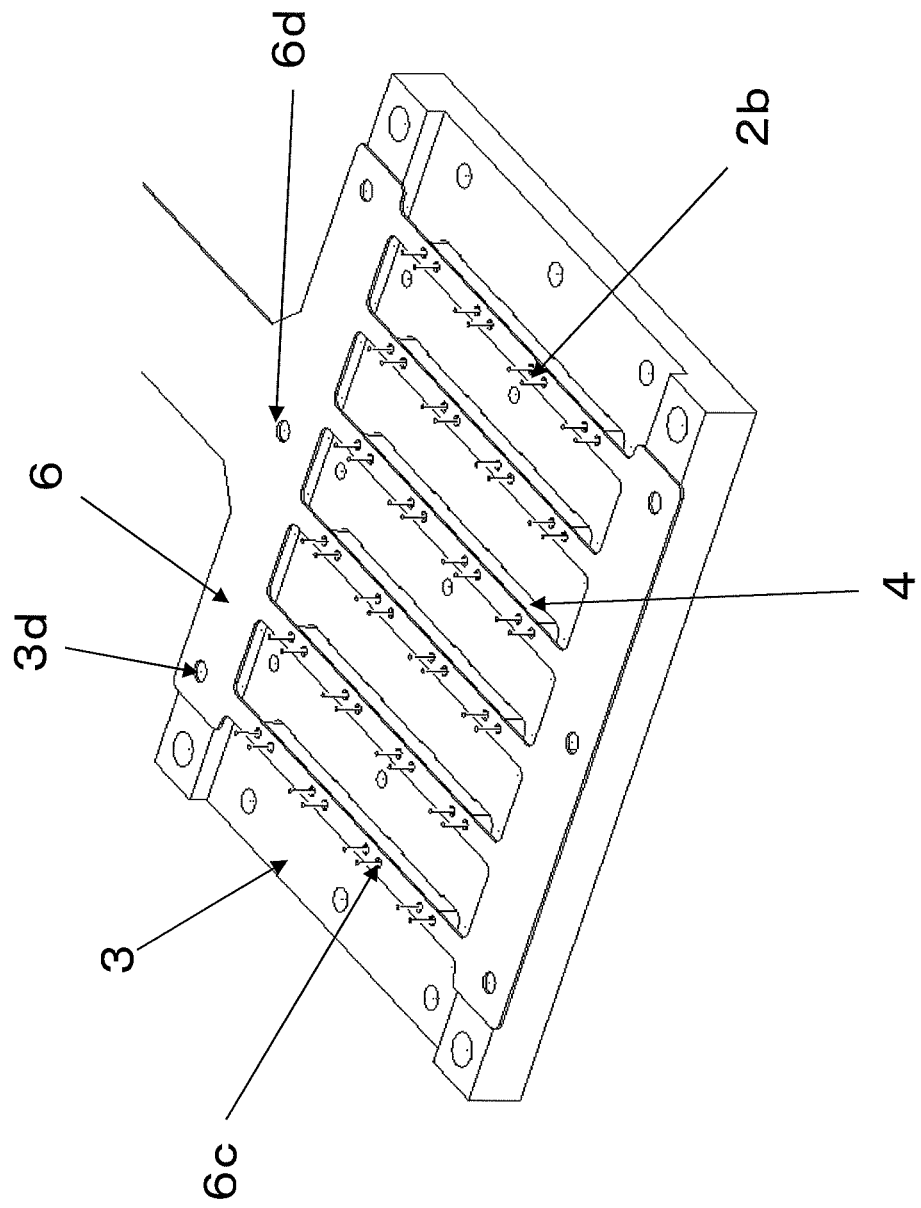
FIG. 9B illustrates positions of the wiring base and the laser holder according to one embodiment (third embodiment) of the present invention.

A structure of a laser array light source unit according to the present embodiment will be described with reference to FIG. 9A and FIG. 9B. FIG. 9A illustrates positions of a wiring base 6, a laser holder 3, and a jig 8, and FIG. 9B illustrates the positions of the wiring base 6 and the laser holder 3. FIG. 9B is for illustrating the positional relationship between the wiring base 6 and the laser holder 3 in a state where the jig 8 is removed. The jig 8 described herein is a component used when the laser array light source unit is to be built in an actual production process.

In this case, as shown in FIG. 9A, the wiring base 6 has second through-holes 6d different from first through-holes 6c into which leading electrodes are inserted. Reference pins 8a provided in the jig 8 pass through reference holes 3d provided in the laser holder 3 and further pass through the second through-holes 6d. The first through-holes 6c of the wiring base 6 are located so as to correspond to through-holes 4a of the insulator 4 in a state where the reference pins 8a have passed through the reference holes 3d of the laser holder 3 and the second through-holes 6d of the wiring base 6. Components other than these can be the same as described in the first embodiment, and thus are denoted by the same reference characters, and the description thereof is omitted.

By passing the reference pins 8a of the jig 8 through the reference holes 3d of the laser holder 3 and the second through-holes 6d provided in the wiring base 6 as described above, the first through-holes 6c and the through-holes 4a of the insulator 4 are necessarily positioned so as to correspond to each other. This can ensure prevention of error when the leading electrodes of the semiconductor lasers 2 are to be inserted into the through-holes 4a of the insulator 4 and prevention of breakage of the leading electrodes due to error in the insertion.

Fourth Embodiment

Figure 10:
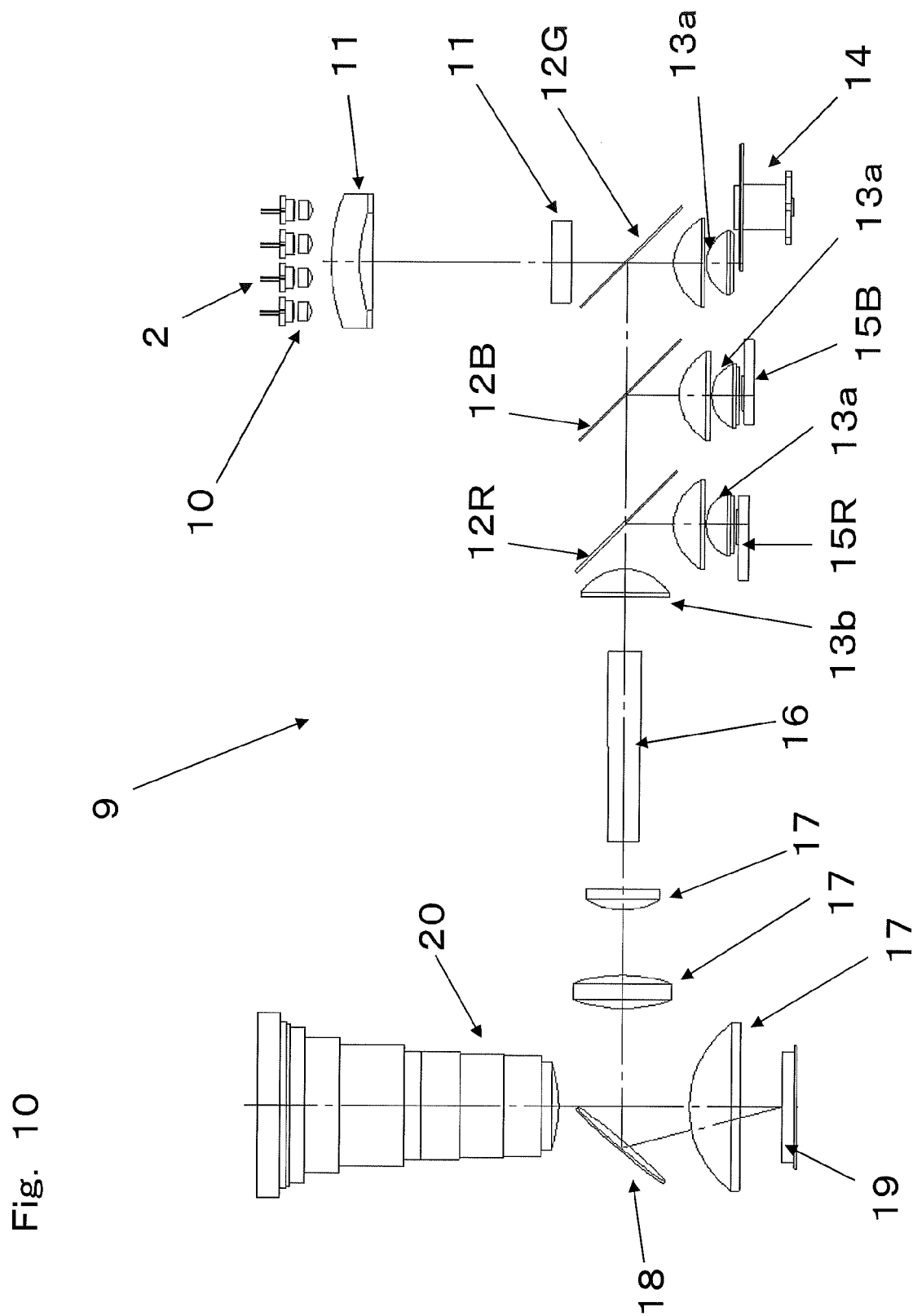
FIG. 10 schematically illustrates a structure of a projector (fourth embodiment) using the laser array light source unit according to one embodiment (first embodiment) of the present invention.

A projector according to the present embodiment will be described with reference to FIG. 10. FIG. 10 schematically illustrates a structure of a projector 9 using the laser array light source unit 1 according to the present invention. As shown in FIG. 10, light emitted from each semiconductor laser 2 is collimated by a collimating lens 10 provided in the front of each semiconductor laser 2, and then passes through condensing lenses 11. Subsequently, the light transmits through a dichroic mirror 12 and a first condenser lens group 13a, and excites fluorescent wheel 14 to which a green fluorescent material is applied, whereby green light is emitted in the direction opposite to the direction of the light from the semiconductor lasers. The emitted light returns to the first condenser lens group 13a, is reflected by a green light-reflecting dichroic mirror 12G, transmits through a blue light-reflecting dichroic mirror 12B, a red light-reflecting dichroic mirror 12R, and a second condenser lens 13b, and then enters a rod integrator 16. Light from a blue LED 15B and light from a red LED 15R transmit through first condenser lens groups 13a, and are reflected by the blue light-reflecting dichroic mirror 12B and the red light-reflecting dichroic mirror 12R, respectively, and transmit through the second condenser lens 13b, and then enter the rod integrator 16. The light having been uniformed through the rod integrator 16 passes through relay lenses 17 and a reflective lens 18, and then passes a DMD (Digital Micromirror Device) 19. The light having passed the DMD 19 further passes through a projection lens 20, and is projected onto a target object.

The laser array light source unit of the present invention is applicable not only to projectors but also to scanning optical systems of various image forming devices such as copying machines, facsimiles, printers, and digital laboratories.

The laser array light source unit of the present invention is configured to efficiently release heat generated from a plurality of semiconductor lasers. The present invention can provide a laser array light source unit having a structure that can efficiently release heat generated from semiconductor lasers, that can easily be built, and that can realize physical and electrical separation even when a plurality of semiconductor lasers are densely arranged. Therefore, the present invention is applicable to, for example, scanning optical systems of image forming devices used for projectors and the like.

What is claimed is:

1. A laser array light source unit comprising:
    a plurality of semiconductor lasers each including a main body portion and a leg portion with a leading electrode;
    a laser holder including receiving surfaces for holding the main body portions of the plurality of semiconductor lasers, and through-holes into which the leg portions of the plurality of semiconductor lasers are inserted;
    an insulator including a plurality of electrode insertion portions having through-holes into which the respective leading electrodes of the plurality of semiconductor lasers are inserted; and
    a wiring base for electrically connecting at least two of the plurality of semiconductor lasers in series, wherein
    the insulator includes a connecting portion for connecting the plurality of electrode insertion portions in the same direction in which the plurality of semiconductor lasers are arranged,
    each of the through holes, of the insulator, into which the respective leading electrodes are inserted includes: a leading electrode inlet into which a corresponding one of the leading electrodes is inserted; a leading electrode outlet through which the corresponding one of the leading electrodes exits; and a small-diameter portion formed between the leading electrode inlet and the leading electrode outlet, wherein a portion between the leading electrode inlet and the small-diameter portion is tapered such that a diameter on the leading electrode inlet side is greater than a diameter on the small-diameter portion side, and a portion between the small-diameter portion and the leading electrode outlet is tapered such that a diameter on the leading electrode outlet side is greater than a diameter on the small-diameter portion side, and
    the wiring base includes first through-holes into which the respective leading electrodes of the plurality of semiconductor lasers are inserted.

2. The laser array light source unit according to claim 1, further comprising a cooling device, wherein
    a heat-releasing surface is formed on a surface of the laser holder opposite to a surface on which the receiving surfaces are formed, and
    the cooling device has a heat-receiving surface that contacts the heat-releasing surface.

3. The laser array light source unit according to claim 2, wherein
    the laser holder includes, on the surface opposite to the surface on which the receiving surfaces are formed, a cooling device-contacting portion whose protruding length is greater than portions of the respective leading electrodes of the plurality of the semiconductor lasers that protrude from the first through-holes of the wiring base, and the heat-releasing surface is formed on an end of the cooling device-contacting portion, and contacts the heat-receiving surface of the cooling device in a state where the plurality of semiconductor lasers are attached to the laser holder via the insulator and the wiring base.

4. The laser array light source unit according to claim 2, wherein the cooling device includes recesses having such a depth that portions of the respective leading electrodes of the plurality of the semiconductor lasers that protrude from the first through-holes of the wiring base can be inserted into the recesses without contact with the cooling device, and the heat-releasing surface formed on the surface of the laser holder opposite to the surface on which the receiving surfaces are formed contacts the heat-receiving surface of the cooling device in a state where the plurality of semiconductor lasers are attached to the laser holder via the insulator and the wiring base.

5. The laser array light source unit according to claim 1, wherein a diameter of the first through-holes of the wiring base into which the respective leading electrodes of the plurality of the semiconductor lasers are inserted is larger than the diameter of the small-diameter portions of the through-holes of the insulator.

6. The laser array light source unit according to claim 5, wherein, in the wiring base, a width of a row wiring portion provided for each row of the semiconductor lasers arranged along the insulator is almost equal to a width of the insulator.

7. The laser array light source unit according to claim 6, wherein the connecting portion of the insulator has a surface formed in the same plane in which the leading electrode outlet of the electrode insertion portion is formed.

8. The laser array light source unit according to claim 7, wherein the wiring base includes a second through-hole different from the first through-holes into which the leading electrodes are inserted, when a reference pin is provided in the laser holder, the reference pin passes through the second through-hole, and the first through-holes of the wiring base are located at positions corresponding to the through-holes of the insulator in a state where the reference pin is inserted in the second through hole.

9. The laser array light source unit according to claim 7, wherein the wiring base includes a second through-hole different from the first through-holes into which the leading electrodes are inserted, when a reference hole is provided in the laser holder and a reference pin which passes through the reference hole is provided in a jig used for holding the laser holder, the reference pin passes through the second through-hole, and the first through-holes of the wiring base are located at positions corresponding to the through-holes of the insulator in a state where the reference pin is inserted in the second through hole and the reference hole.

10. The laser array light source unit according to claim 1, wherein the leg portion each of the plurality of semiconductor lasers includes has two leading electrodes, the laser array light source unit therein further comprising:

a pressing member for fixing the plurality of semiconductor lasers to the laser holder.

11. A laser array light source unit comprising:

a plurality of semiconductor lasers each including a main body portion and a leg portion with a leading electrode;

a laser holder including receiving surfaces for holding the main body portions of the plurality of semiconductor lasers, and through-holes into which the leg portions of the plurality of semiconductor lasers are inserted;

an insulator including a plurality of electrode insertion portions having through-holes into which the respective leading electrodes of the plurality of semiconductor lasers are inserted;

a wiring base for electrically connecting at least two of the plurality of semiconductor lasers in series; and a cooling device; wherein the laser holder includes, formed on a surface opposite to a surface on which the receiving surfaces are formed, a cooling device-contacting portion on an end of which a heat-releasing surface is formed, the cooling device has a heat-receiving surface that contacts the heat-releasing surface, the cooling device-contacting portion of the laser holder protrudes by a length greater than portions of the respective leading electrodes of the plurality of the semiconductor lasers that protrude from the first through-holes of the wiring base, the heat-releasing surface of the cooling device-contacting portion contacts the heat-receiving surface of the cooling device in a state where the plurality of semiconductor lasers are attached to the laser holder via the insulator and the wiring base, the insulator includes a connecting portion for connecting the plurality of electrode insertion portions in the same direction in which the plurality of semiconductor lasers are arranged, and the wiring base includes first through-holes into which the respective leading electrodes of the plurality of semiconductor lasers are inserted.

12. A laser array light source unit comprising:

a plurality of semiconductor lasers each including a main body portion and a leg portion with a leading electrode;

a laser holder including receiving surfaces for holding the main body portions of the plurality of semiconductor lasers, and through-holes into which the leg portions of the plurality of semiconductor lasers are inserted;

an insulator including a plurality of electrode insertion portions having through-holes into which the respective leading electrodes of the plurality of semiconductor lasers are inserted;

a wiring base for electrically connecting at least two of the plurality of semiconductor lasers in series; and a cooling device; wherein a heat-releasing surface is formed on a surface of the laser holder opposite to a surface on which the receiving surfaces are formed, the cooling device has a heat-receiving surface that contacts the heat-releasing surface, the insulator includes a connecting portion for connecting the plurality of electrode insertion portions in the same direction in which the plurality of semiconductor lasers are arranged, the wiring base includes first through-holes into which the respective leading electrodes of the plurality of semiconductor lasers are inserted, the cooling device includes recesses having such a depth that portions of the respective leading electrodes of the plurality of the semiconductor lasers that protrude from the first through-holes of the wiring base can be inserted into the recesses without contact with the cooling device, and the heat-releasing surface of the laser holder contacts the heat-receiving surface of the cooling device in a state where the plurality of semiconductor lasers are attached to the laser holder via the insulator and the wiring base.

* * * * *